United States Patent [19]

Matsunaka et al.

[11] Patent Number: 5,146,583
[45] Date of Patent: Sep. 8, 1992

[54] LOGIC DESIGN SYSTEM FOR CREATING CIRCUIT CONFIGURATION BY GENERATING PARSE TREE FROM HARDWARE DESCRIPTION LANGUAGE AND OPTIMIZING TEXT LEVEL REDUNDANCY THEREOF

[75] Inventors: Masahiko Matsunaka, Osaka; Tamotsu Nishiyama, Hirakata; Masahiko Ueda, Kashiwara, all of Japan

[73] Assignee: Matsushita Electric Industrial Co., Ltd., Osaka, Japan

[21] Appl. No.: 734,113

[22] Filed: Jul. 24, 1991

Related U.S. Application Data

[63] Continuation of Ser. No. 249,554, Sep. 26, 1988, abandoned.

[30] Foreign Application Priority Data

Sep. 25, 1987 [JP] Japan ............................ 62-241289
Mar. 15, 1988 [JP] Japan ............................ 63-61081

[51] Int. Cl.⁵ ............................................ G06F 15/20
[52] U.S. Cl. ................................. 395/500; 364/489; 364/221.2; 364/221.8; 364/DIG. 1

[58] Field of Search ... 364/200 MS File, 900 MS File, 364/488, 489, 490, 491; 395/500

[56] References Cited

U.S. PATENT DOCUMENTS

| | | | |
|---|---|---|---|
| 4,703,435 | 10/1987 | Darringer et al. | 364/489 |
| 4,791,356 | 12/1988 | Warren et al. | 371/22.1 |
| 4,803,636 | 2/1989 | Nishiyama et al. | 364/491 |
| 4,816,999 | 3/1989 | Berman et al. | 364/489 |
| 4,817,029 | 3/1989 | Plum et al. | 364/732 |

*Primary Examiner*—Thomas C. Lee
*Assistant Examiner*—Ayni Mohamed
*Attorney, Agent, or Firm*—Wenderoth, Lind & Ponack

[57] ABSTRACT

An apparatus and method for translating a function description of a circuit presented in hardware description language includes parsing the function description of the circuit to generate a parse tree. The structure of the parse tree is deformed to optimize the test level redundancy of the function description to thereby generate a deformed parse tree. The deformed parse tree is then translated into function blocks representing a hardware configuration of the circuit set forth by the function description.

7 Claims, 14 Drawing Sheets

FIG.2

```
BEHAVIOR - SECTION ;
BEGIN
  AT.MCK DO
    IF ^.NRESET THEN
            ROUT := 0 ;
            STATE := 0
          ELSE
            IF ^.SEL THEN
                    ROUT := .RUNIN ;
                    STATE := 1
                  ELSE
                    CASE STATE OF
                        #0 BEGIN
                            ROUT := .RUNIN ;
                            IF .RUNIN<3> THEN
                                    ROUT := .RUNIN ;
                                    STATE := 1
                            END - IF
                          END
                        #1 CASE .RUNIN OF
                              #0 STATE := 3
                              #1 BEGIN
                                  COUNT := 0 ;
                                  STATE := 2
                                END
                              #2 STATE := 0
                              ELSE BEGIN
                                  COUNT := .RUNIN ;
                                  STATE := 2
                                END
                            END - CASE
                        #2 BEGIN
                            COUNT := DEC(COUNT) ;
                            IF COUNT=0 THEN
                                    STATE := 0
                            END - IF
                          END
                    END - CASE
            END - IF
    END - IF
  END - DO ;
  .RUNDATA := ROUT
END
END - SECTION ;
END ;
```

(IF.STATE                (IF CONDITION.CLOSE THEN.CLOSE END-IF)
                         (IF CONDITION.CLOSE THEN.CLOSE ELSE.CLOSE END-IF)
(THEN.CLOSE              (THEN FUNCTION.STATE.RFR)
(ELSE.CLOSE              (ELSE FUNCTION.STATE.RFR)
(CONDITION.CLOSE         (SIMPLE.EXP)
(CASE.STATE              (CASE CONDITION.CLOSE OF CASE.CLOSE.RFR END-CASE
(CASE.CLOSE.RFR          (CASE.CLOSE)
                         (CASE.CLOSE CASE.CLOSE.RFR)
(CASE.CLOSE              (# CASE.NUM FUNCTION.STATE.RFR))
(CASE.NUM                (integer))

302

(IF          HSL-FX.WORD          HEAD_OF_IF.STATE)
(THEN        HSL-FX.WORD          HEAD_OF_THEN.CLOSE)
(ELSE        HSL-FX.WORD          HEAD_OF_ELSE.CLOSE)
(END-IF      HSL-FX.WORD          TAIL_OF_IF.STATE)
(CASE        HSL-FX.WORD          HEAD_OF_CASE.STATE)
(OF          HSL-FX.WORD          NEXT_TO_CASE.CONDITION)
(END-CASE    HSL-FX.WORD          TAIL_OF_CASE.STATE)
(#           SPECIAL-CHAR         DELIMITER)

FIG. 4 if x then a else b end-if ;    ⟵ 40

⟵ 402

```
(IF.STATE
    ((IF HSL-FX.WORD HEAD_OF_IF.STATE)
    (CONDITION.CLOSE
        ((SIMPLE.EXP
            ((TERM ((P.NAME ((P-NAME X VAR))))))))
    (THEN.CLOSE
        ((THEN HSL-FX.WORD HEAD_OF_THEN.STATE)
        (SIMPLE.EXP
            ((TERM ((P.NNAME ((P-NAME A VAR))))))))
    (ELSE.CLOSE
        ((ELSE HSL-FX.WORD HEAD_OF_ELSE.CLOSE)
        (SIMPLE.EXP
            ((TERM ((P.NNAME ((P-NAME B VAR))))))))
    (END-IF HSL-FX.WORD TAIL_OF_IF.STATE)
    (; SPECIAL-CHAR DELIMITER))))
```

FIG. 8
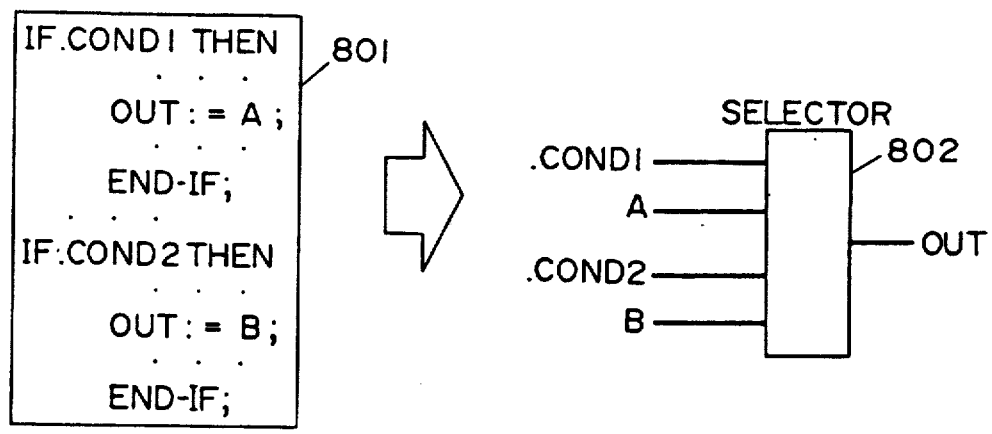
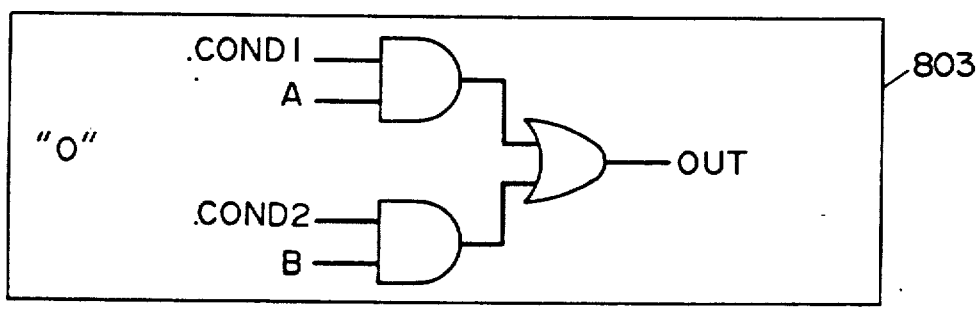
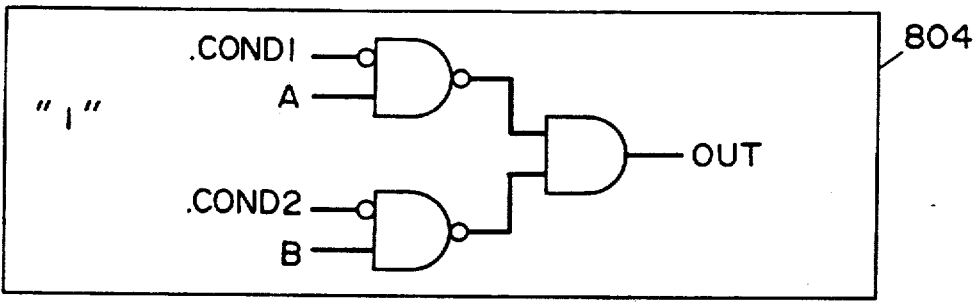
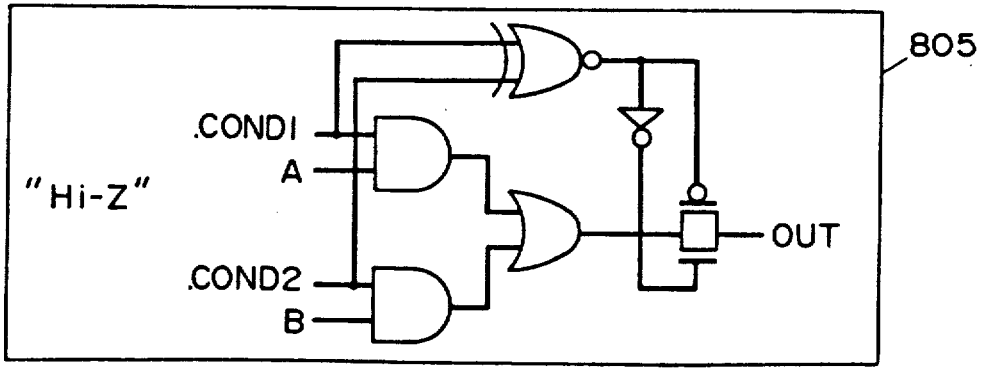

FIG. 10

```
((ITEM1  *var1)
 (ITEM2  *var2)
 ........
 (ITEMn  *varn)
     →  (action 1)
        (action 2)
        ......
        (action 3))
```

FIG.13

```
macro1 ::: a_kind_of :: inv_fc ;
         input :: x ;
         output :: net2 ;
         bitwidth :: 1 .

macro3 ::: a_kind_of :: and_fc ;
         input :: [x , y] ;
         output :: net4 ;
         bitwidth :: 1 .

macro5 ::: a_kind_of :: inv_fc ;
         input :: y ;
         output :: net6 ;
         bitwidth :: 1 .

macro7 ::: a_kind_of :: and_fc ;
         input :: [x , net6] ;
         output :: net8 ;
         bitwidth :: 1 .

macro9 ::: a_kind_of :: and_fc ;
         input :: [net2, z] ;
         output :: net10 ;
         bitwidth :: 1 .

macro11 ::: a_kind_of :: inv_fc ;
         input :: z ;
         output :: net12 ;
         bitwidth :: 1 .

macro13 ::: a_kind_of :: and_fc ;
         input :: [net2, net12] ;
         output :: net14 ;
         bitwidth :: 1 .

macro15 ::: a_kind_of :: selector ;
         input :: [[net4, a], [net8, b], [net10, c], [net14, d]] ;
         output :: out ;
         bitwidth :: 2 .
```

FIG. 14
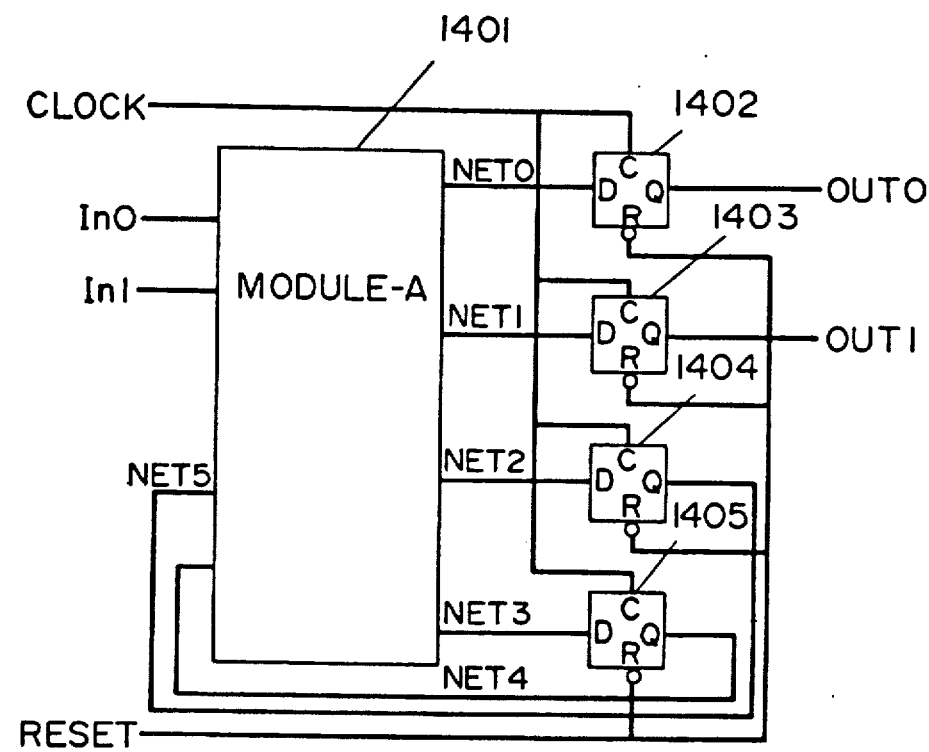
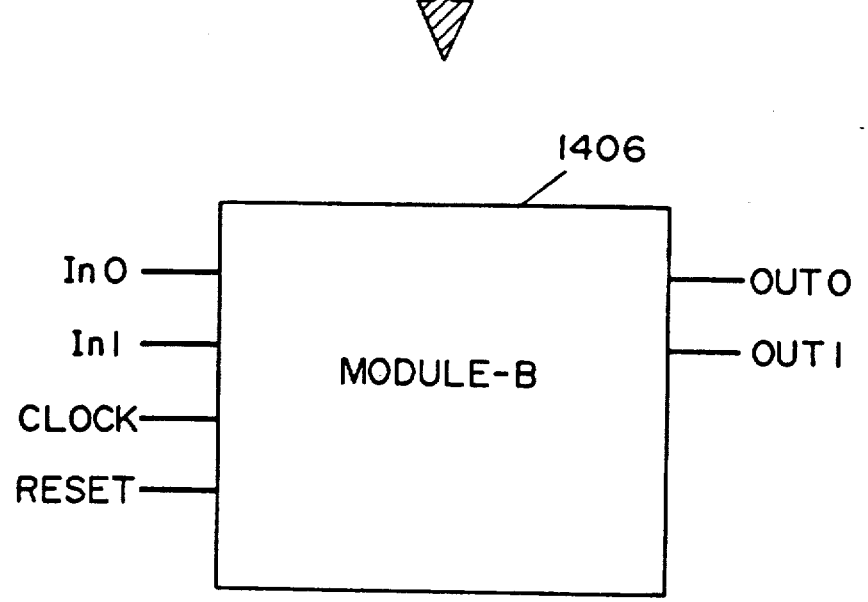

LOGIC DESIGN SYSTEM FOR CREATING CIRCUIT CONFIGURATION BY GENERATING PARSE TREE FROM HARDWARE DESCRIPTION LANGUAGE AND OPTIMIZING TEXT LEVEL REDUNDANCY THEREOF

This application is a continuation of now abandoned application, Ser. No. 07/249,554 filed on Sep. 26, 1988.

BACKGROUND OF THE INVENTION

This invention relates to automation of logic designing in IC, LSI. In the trend of large scale and high integration represented by VLSI, it is an urgent problem to reduce the manpower required in development and to eliminate the chronic shortage of designers. These matters are expected to be solved by development of various CAD tools, but as for the logic designing, at the present, many subjects are left unsolved before realization.

For example, when automatically translating from the hardware descriptive language into a logic circuit, the following problems were experienced in the conventional system.

(1) The hardware description language that can be processed is fixed.

The conventional system, was designed to translate only a specific description language. Therefore, when the description language was changed, the program had to be drastically revised.

(2) Abstract expressions cannot be used in circuit operation.

The hardware description languages are classified by the structural level, functional level and behavioral level used in describing a circuit. In the conventional description language translator model, the structural level was mostly used because it was possible to correspond directly to the circuit. The output called net list obtained with respect to more abstract description such as functional level and behavioral level was inferior in quality as compared with that obtained manually.

(3) Translation is effected while leaving the redundancy of description as it is.

As one of the causes of the poor quality of the result of translation from the description of the functional or higher level indicated in (2), translation together with the remaining redundancy may be listed. In the functional design which is a step before logic design, the designer puts the first emphasis on realization of function of desired circuit. Therefore, as for the redundancy for expressing this function, the designer pays little attention to redundant expression, assuming that it will be eliminated in the logic designing state. In a simple serial translation algorithm, since the redundancy of expression is not taken into consideration, multiple portions having same functions are present within a same circuit.

(4) The intent of the designer is not expressed in the result of output.

When realizing a function expressed in a description language in a circuit, many selection limb may be present. In such a case, the designer selects a most practical means depending on the case, but in the conventional system, practically, only a preprogrammed method could be selected, and it was difficult to express the intent of the designer in the circuit.

SUMMARY OF THE INVENTION

It is hence a primary object of this invention to present a method for converting a text involving an abstractness of functional or higher level so that the intent of the designer may be expressed in the output of the net list, while eliminating the redundancy of description, and a logic designing system using the same method.

To achieve the above object, the translating method of this invention is provided to translate a function description into a connection information between function blocks, by way of a parsing step for parsing the function description in a hardware description language and generating a parse tree, a tree structure deforming step for deforming the generated parse tree, and a function block generating step for translating the deformed parse tree into function blocks, particularly in which in the tree structure deforming step an inquiry about translation or logic design is made to the designer or a knowledge source.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF DRAWINGS

FIG. 2 is a drawing showing an input text example by hardware description language HSL-FX;

FIG. 3 is an explanatory drawing showing part of the syntax and dictionary of HSL-FX;

FIG. 4 is an explanatory drawing of a parse tree obtained as a result of parsing and a part of text in HSL-FX;

FIG. 8 is an explanatory drawing of an inquiry relating to nonselection state;

FIG. 10 is an explanatory drawing of a general format of IF-THEN type rule base;

FIG. 13 is an explanatory drawing of a function block by frame type; and

FIG. 14 is an explanatory drawing relating to module parsing example.

DETAILED DESCRIPTION OF THE INVENTION

Figure 1:
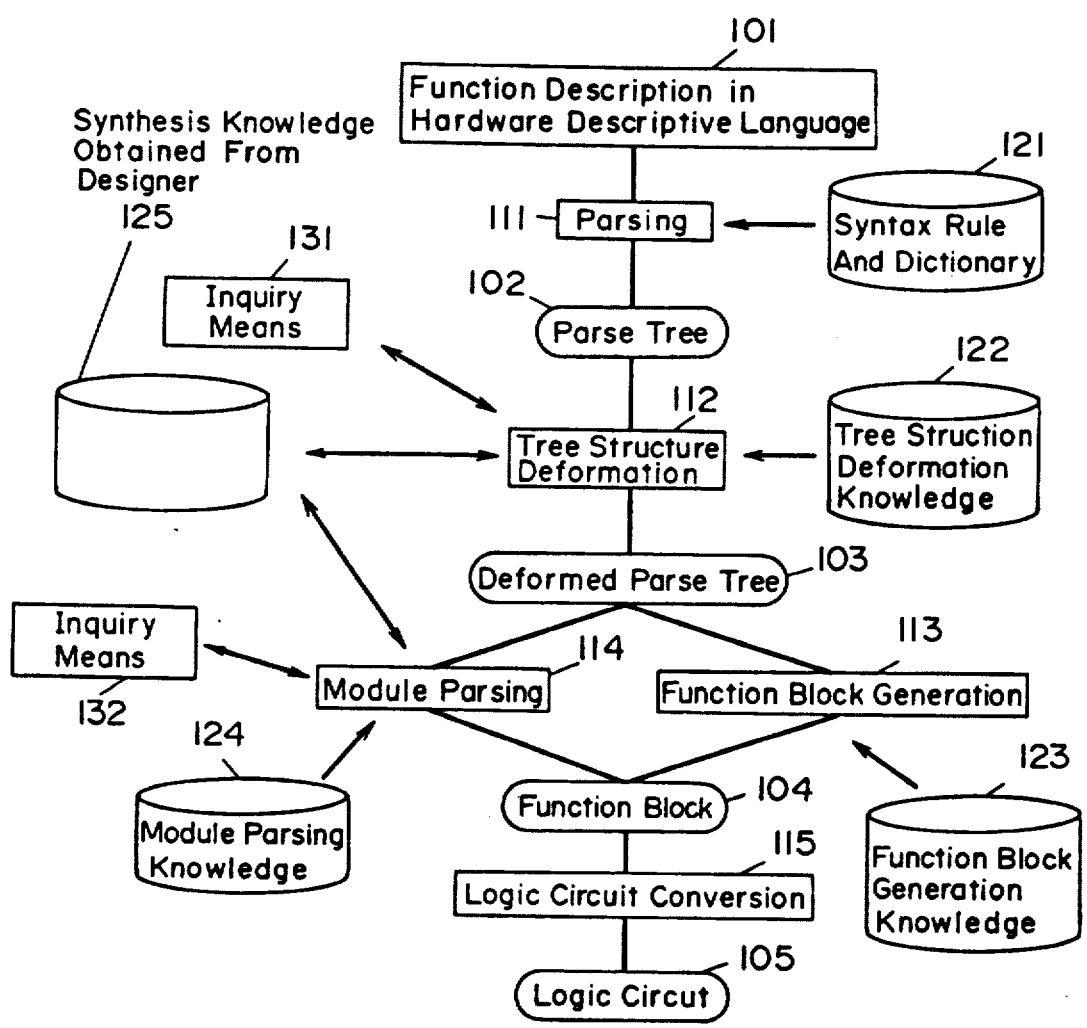
FIG. 1 is a block diagram of a function description translation system.

Referring now to the drawings, some of the embodiments of this invention are described below. First the operational flow of a translation processing is explained. FIG. 1 is a block diagram of a function description translation system depicting one of the embodiments of this invention. The input to this system is a function description 101 represented in hardware description language. The function description 101 is stored as file in an external memory of a computer. FIG. 2 shows a practical example of this file data in hardware description language HSL-FX. The first processing of this system includes reading and parsing all the function description 101 of the file to generate a parse tree 102. At this time the syntax rule and dictionary unit 121 are referred to in order to confirm that the function description is written in correct grammatical terms. FIG. 3 shows part of the syntax and dictionary of HSL-FX. By exchanging the data, processing is also possible for descriptive languages other than HSL-FX. FIG. 4 shows part of a text in the event of a normal parsing, and an example of the corresponding parse tree.

When the parse tree is obtained, processing operation 112 to deform the tree structure of the parse tree is effected as required. When deforming the tree structure, a tree structure deformation knowledge unit 122 is used. As described in detail later, the tree structure deforming processing operation includes a function for inquiring the knowledge base or the designer, that is, the user, and the inquiry means 131 in this case is closely related with the tree structure deforming processing unit. The result of inquiry is stored in the knowledge 125 obtained from the designer, and if necessary thereafter, this knowledge base is referred to. Thus, a deformed parse tree 103 is obtained.

Thereafter, a functional block generating processing operation 113 for converting the parse tree into a function block, and a module parsing processing operation 114 for optimizing between circuit modules are effected. At the time of the function block generation, a functional block generating knowledge unit 123 is used. A module parsing is effected by using a module parsing and knowledge unit 124, and includes an inquiry function as in the tree structure deformation, the inquiry means 132 being prepared for that purpose. The result of inquiry is stored in the composite knowledge unit 125 previously obtained from the designer before.

After these processing operations a net list 104 between functional blocks is generated. In order to translate the function blocks into a real logic in the targeted technology, a logic circuit converting processing operations 115 is effected, and finally a net list 105 of real logic is obtained. The logic circuit translation 115 comprises function block developing processing and technology mapping processing.

Now, details of the processing operations 111, 112, 113, 114, 115 are explained below. As the parsing processing operations, the data which has been first read is looked up in the dictionary at the level of a word. When the registration of the searched item in the dictionary is confirmed, the information about this word is extracted. What is entered in the dictionary is the spelling of word, and its attribute (or part of speech in natural language) and meaning. After looking up in the dictionary, the attribute of the retrieval item is assigned to the syntax. Meanwhile, regarding the parsing algorithm, various types have been developed so far, but any one may be used in this invention.

As the next processing operation after parsing, the tree structure deformation operation 112 is effected. By this processing operation, the parse tree 102 is deformed into a deformed parse tree 103. The purposes of deformation of the parse tree include the following.

Figure 5:
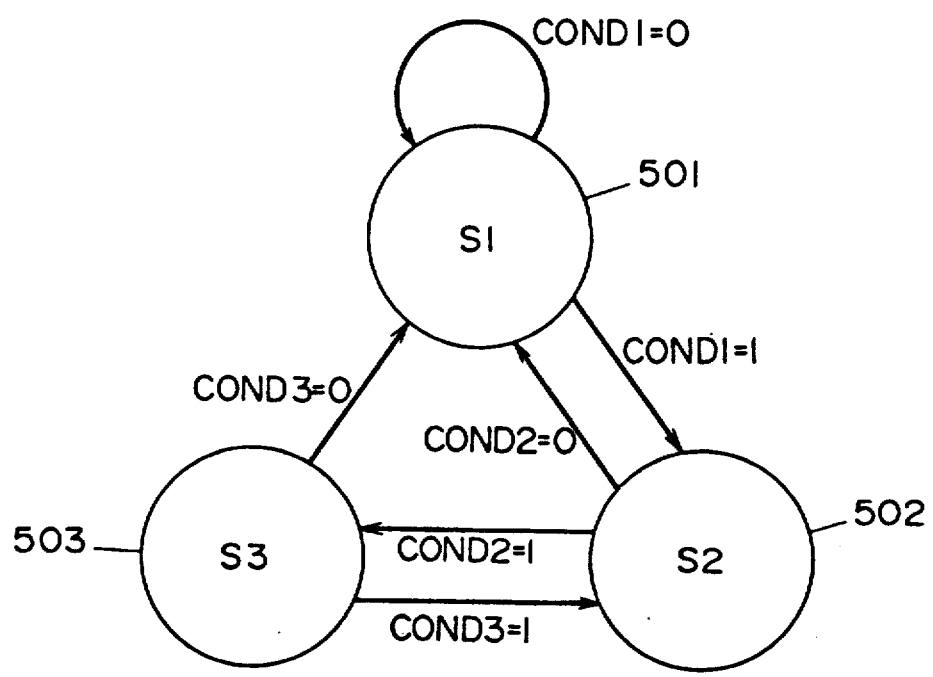
FIG. 5 is a state transition drawing of an automaton.

(1) to facilitate the conversion of expression not corresponding directly to the logic circuit in the text
(2) to eliminate the redundancy in expression
(3) to inquire to the designer or the knowledge source As an example of (1), for instance, the expression of automaton may be considered. The automaton is often used in the VLSI design as an effective means for expressing the circuit operation. FIG. 5 shows an example of automaton. In this example, three states S1, S2, S3 are prepared. This automaton has the following transition rule. In state S1, as long as signal COND1 is 0, it is not transferred to other state. When COND1 becomes 1, it is transferred to state S2. In state S2, if COND2 is 0, it is transferred to S1, and if 1, it is transferred to S3. In state S3, if COND3 is 0, it is transferred to S1, and if 1, it is transferred to S2.

This automaton may be described as follows in HSL-FX.

```
AUTOMATON:AUTO1:RSET:CLK;
    S1:(WAITCOND1)→S2;
    S2:IF COND2    THEN→S3
                   ELSE→S1 END-IF;
    S3:IF COND3    THEN→S2
                   ELSE→S1 END-IF;
END-AUTO;
``` where AUTO1 is the name of this automaton, RSET is a reset terminal name, and CLK denotes a clock terminal name. The transition condition is described after each state name. The waiting stat in S1 until COND1 becomes 1 is expressed as (WAIT COND1). The condition branching is expressed by an IF-statement.

When manually designing the circuit for realizing the function of this automaton, a truth table is usually used. In this invention, however, a desired circuit is obtained by semantically deforming the syntax, instead of using the truth table. When HSL-FX is used, it is deformed into a syntax called an AT-statement. According to the above HSL-FX, the automaton expression is as follows.

```
AT.CLK DO
    IF RSET|AUTO1=1 THEN
        IF COND1 THEN AUTO1=2END-IF END-IF;
    IF  RSET & AUTO1=2 THEN
        IF COND2 THEN AUTO1=3
            ELSE AUTO1=1END-IF END-IF;
    IF  RSET & AUTO1=3 THEN
        IF COND3 THEN AUTO1=2
            ELSE AUTO1 = 0END-IF END-IF
END-DO;
```

ATUO1 as used here is not an automaton name, but is instead a register having reset terminal RSET. By using such an expression, the transition rule can be expressed by numerically expressing the present state and keeping that state. The translation to a circuit from here is described later.

Concerning the redundancy in expression, which is the second purpose of the tree structure deformation, it may be considered that the same processing is effected on both the THEN-clause and ELSE-clause in, for example the IF-statement.

```
IF Condition part THEN  processing 1;
                        processing 2
                  ELSE  processing 1;
                        processing 3 END-IF;
```

In this example, processing 1 exists in both the THEN-clause and ELSE-clause, and it is known that the effect of the condition part does not work. This is evidently a redundant expression, and when directly translated into a circuit, an unnecessary gate is formed. Furthermore the gate generated in this way is difficult to remove by local optimization, and with a statement not as simple as shown in the example, when the condition branching is complicated, it is particularly difficult.

In such a case, processing 1 may be placed before the IF-statement.

```
Processing 1;
IF condition part   THEN processing 2
                    ELSE processing 3 END-IF;
```

Thus, processing 1 is free from the effect of the condition part, and a redundant gate is not generated.

The final purpose, i.e. the inquiry to the designer or the knowledge source is the most important processing for tree structure deformation. The designer uses a substantial amount of knowledge meticulously in the logic designing. Most of the information relates to how to take proper measures for realizing the circuit depending on the cases. What the designer requests of the system is that the system generate a circuit in conformity with designer's image of the circuit. The volubility of the system depends on the extent to which the system can incorporate the intent of the designer. If the intent of the designer is ignored, the system will not be actually used by the designer.

However, since the intent of the designer possessed individually, by nature, it is not efficient to program all possible cases in advance. In this invention, therefore, a function to inquire into the designer's intent is provided. When the inquiry seems necessary, the following examples are explained.

Figure 6:
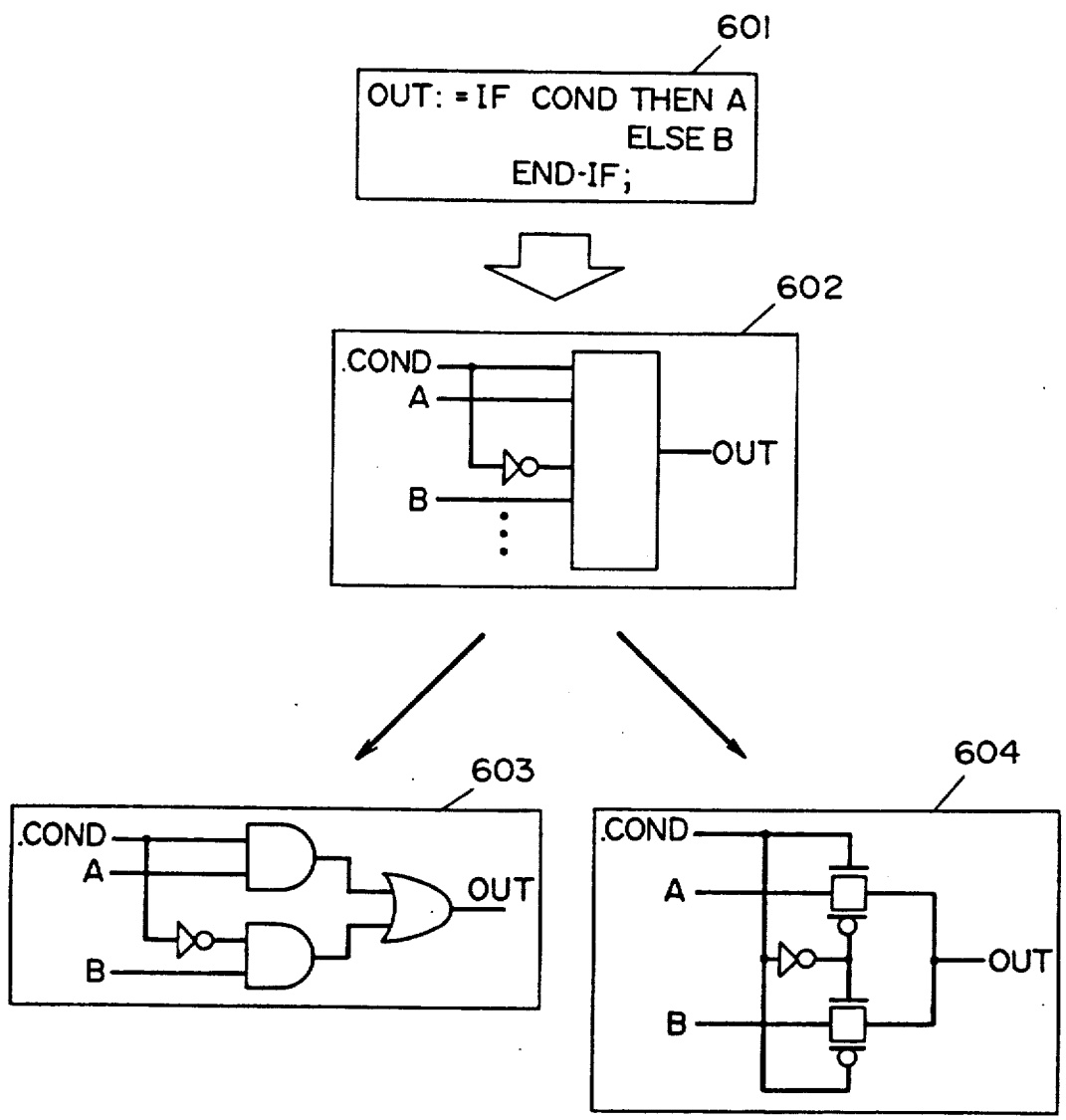
FIG. 6 is an explanatory drawing of an inquiry relating to developing means.
Figure 7:
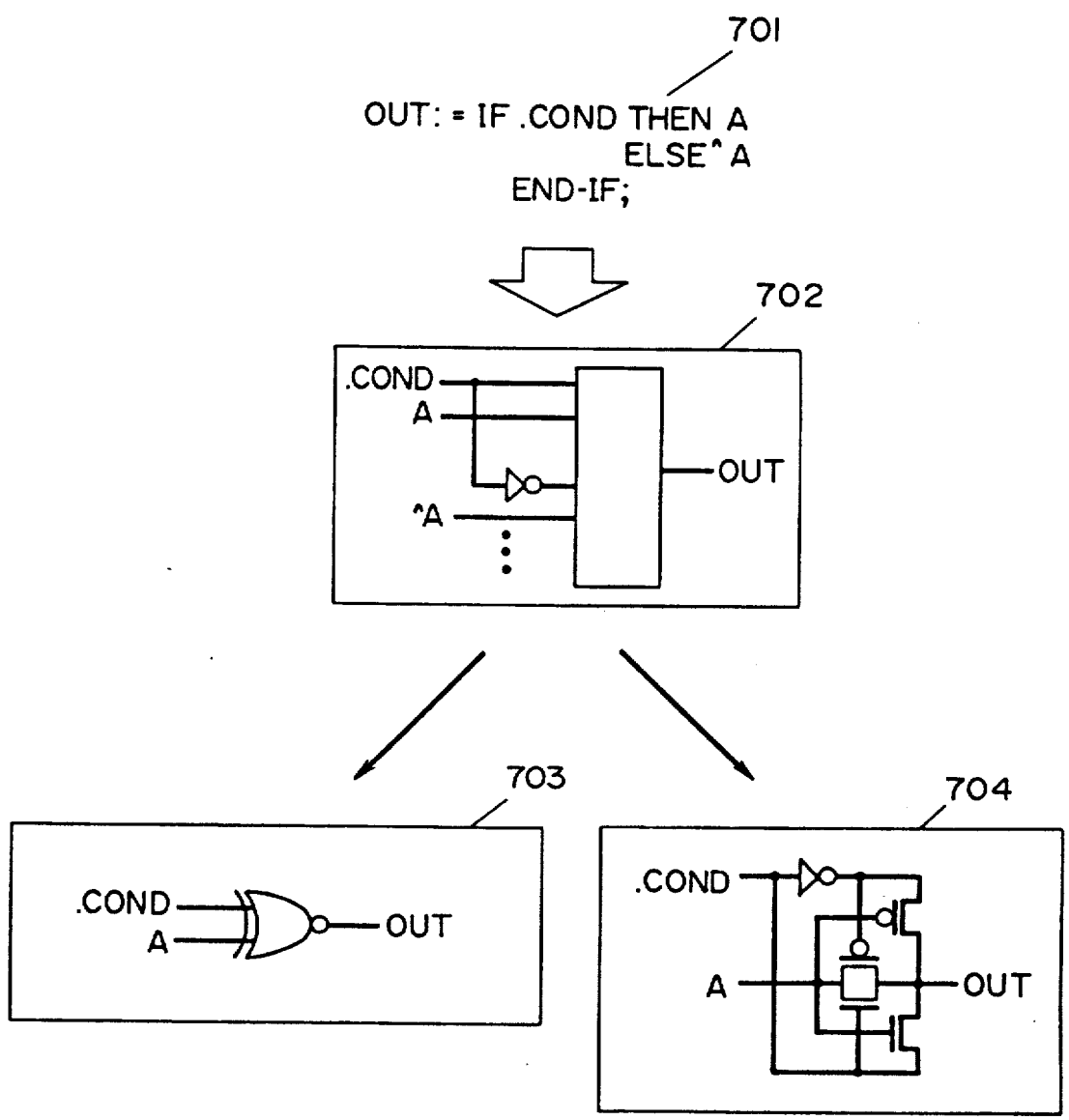
FIG. 7 is an explanatory drawing using other example of an inquiry relating to developing means.

A first example is an inquiry about the developing means from the function block. The developing processing itself of the function block should be done in another subsystem, instead of the translator, but to make this inquiry especially in the upstream of the entire processing of logic designing is important in that the designer be confined for a long time before the terminal. FIG. 6 shows an example in which information about developing means, is necessary. Numeral 601 denotes a processing operation in which either A or B is placed instead of OUT by .COND. Expressing this at the function block levels results in 602. Pairs of inputs of .COND and A, and the negative of .COND and B are connected to the function block expressing the selector. As a result of this connection, if .COND is HI, A becomes HI, and if LOW, the side connected to the inverter is HI, while B is connected to OUT as data. Selection about how to realize this circuit at function block level as actual data is shown by 603 and 604. Numeral 603 is the realizing means according to an ordinary random logic, and 604 according to transfer gate. The information on selection of either means is not mentioned in the input text. As these selection limbs are maintained by the user or the designer, it is possible to convert according to the intent of the designer. FIG. 7 shows an example of substituting A, instead of B, in the case of ELSE, and its inquiry data.

A second example is an inquiry about the nonselection state. FIG. 8 shows an example of an inquiry in order to obtain information about nonselection state. In text 801, the value is not mentioned in the case that neither .COND1 nor .COND2 be selected with respect to output OUT. This is expressed at the function block level by 802. When developing it into real logic, the value of the nonselection state varies depending on the means. Numerals 803, 804 and 805 are the circuits in which 0, 1 and HI-Z are respectively nonselection state values in the condition that .COND1 and .COND2 are not selected simultaneously. Which one is preferable depends on the situation, and it is inquired here.

Figure 9:
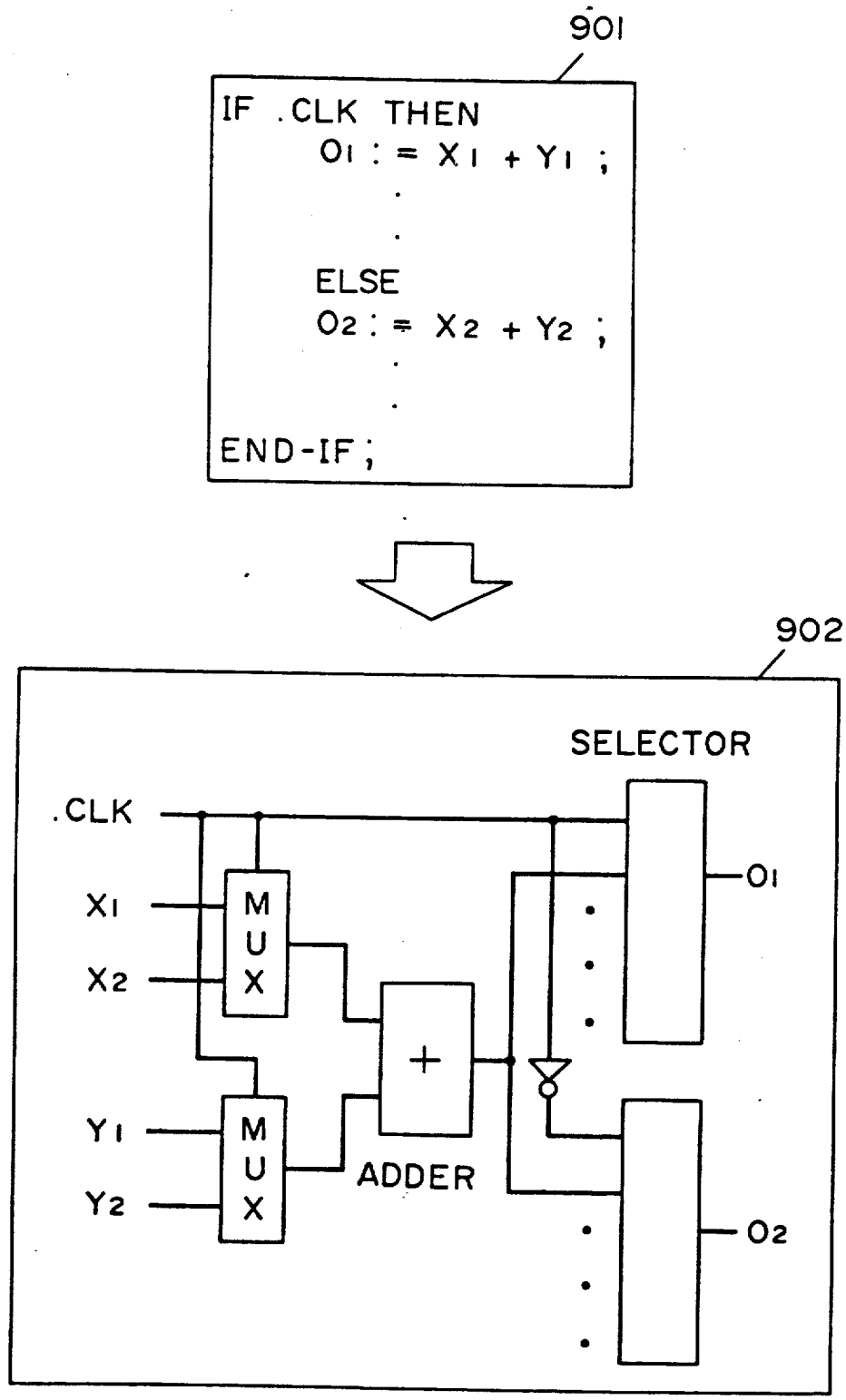
FIG. 9 is an explanatory drawing of an inquiry relating to sharing of partial circuit.

A third example relates to an inquiry about sharing of an partial circuit. FIG. 9 is an example of inquiry for obtaining the information about sharing of a partial circuit. In text 901, 01 is filled with the sum of XL and YL, and 02 is filled with the sum of X2 and Y2, depending on the condition of .CLK. In this example, since operations X1+Y1, and X2+Y2 will not be conducted simultaneously, the adder may be shared by using a branch by a multiplexer. Numeral 902 denotes a circuit diagram of a function block level when the adder is shared. The circuit may be reduced in size by sharing, but an inquiry is made, considering that the designer may not want to share.

The above examples relate to the purposes of tree structure deformation. In consequence, a deformed parse tree is obtained. On the basis of this parse tree, a function block generation processing operation is done. The function block generating procedure is very complicated because it is necessary to cope with all possible expressions according to the hardware descriptive language in use. To flexibly solve this complicated processing, a knowledge base system is used here.

The data written in the knowledge base is a group of rules of IF-THEN type. FIG. 10 shows an example of rule base of IF-THEN type. Each rule is divided into the condition part and execution part across the symbol →. The condition part is a group of pair lists. This is intended to match with the working memory. As the initial value of the working memory, the parse tree can be used as it is. Since the parse tree is generated according to the BNF format as shown in FIG. 2, it is a list of the combination of the right side and left side of the syntax definition. The first element of each list of the condition part is collated against the left side part, and the second element against the right side part. For these collations, use of variables is permitted. Variables are expressed by attaching the identifier @ before the variable name. The variables are matched with any element in the parse tree, and are effective within the range of the rule.

The execution part describes a series of procedures necessary for generating a function block. Some generate the function block directly, and others only rewrite the data in the working memory for applying a next rule. The conversion procedure from the IF statement, CASE statement and substitute statement is explained below.

Figure 11:
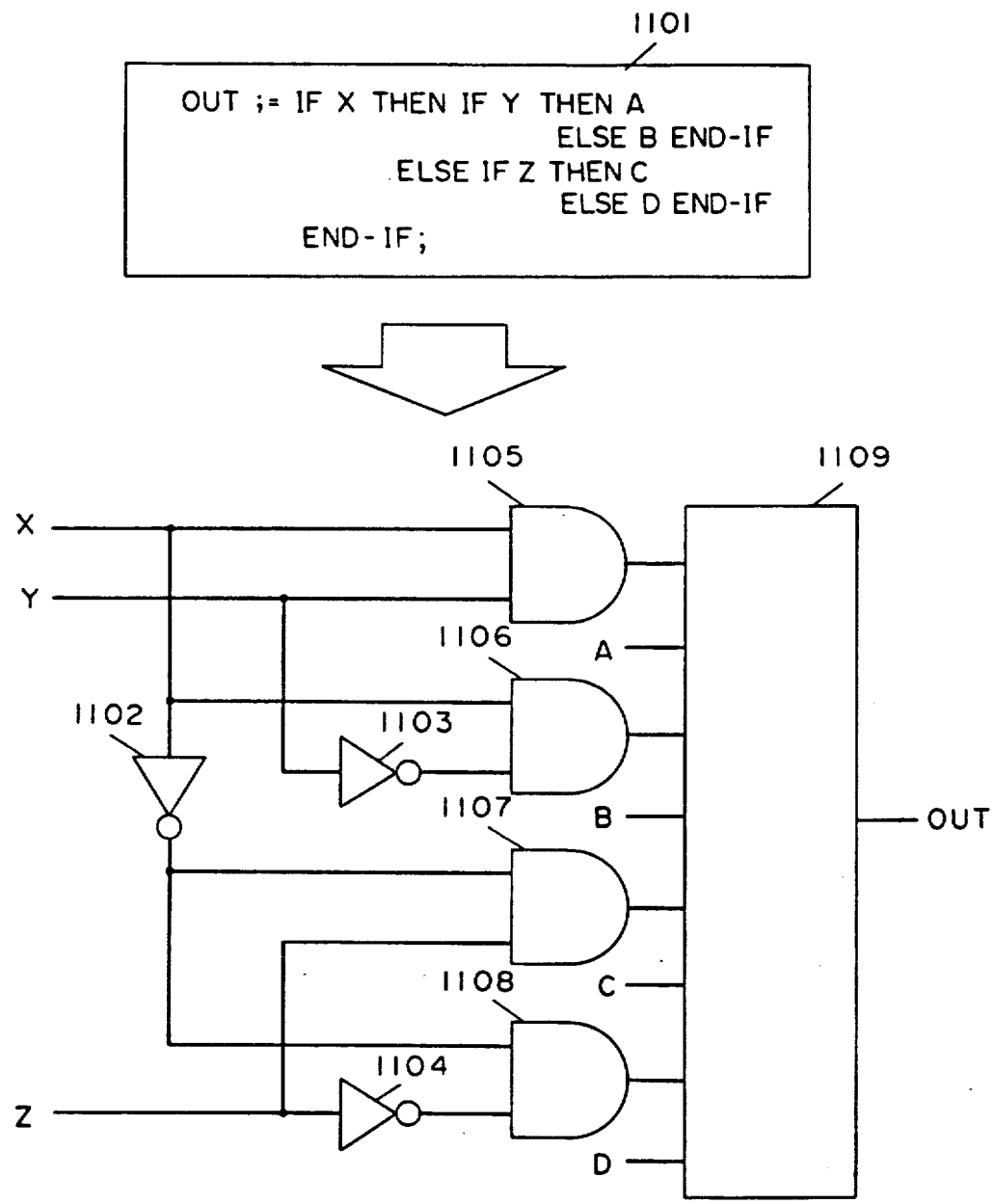
FIG. 11 is an explanatory drawing of a conversion example relating to IF-statement.

FIG. 11 shows a conversion example of an IF statement, in which 1101 represents substitution conditions into OUT using the IF statement. Which value of A, B, C, D is to be substituted is determined by the combination of X and Y, and X and Z. In the net list after conversion, this function is satisfied by the linkage of the inverter gates 1102, 1103, 1104, the gates 1105, 1106, 1107, 1108, and the selector 1109.

As in clear from this example, the condition formula of the IF statement is used in the control of the substitute value after THEN or ELSE. This signal line is called an enable signal. In the case of THEN, there is no change, and in the case of ELSE, the inverter gates are connected. If the IF statement is in a telescopic structure, an AND gate is used, which receive the condition of inside IF statement and that of outside IF statement as inputs. The output of this AND gate is also an enable signal. Substitution into output OUT is effected through the selector which receives pairs of these enable signals and substitute values as inputs. The function of the selector is to use the value pairing with the enable signal is HI state as the output of the selector itself.

Figure 12:
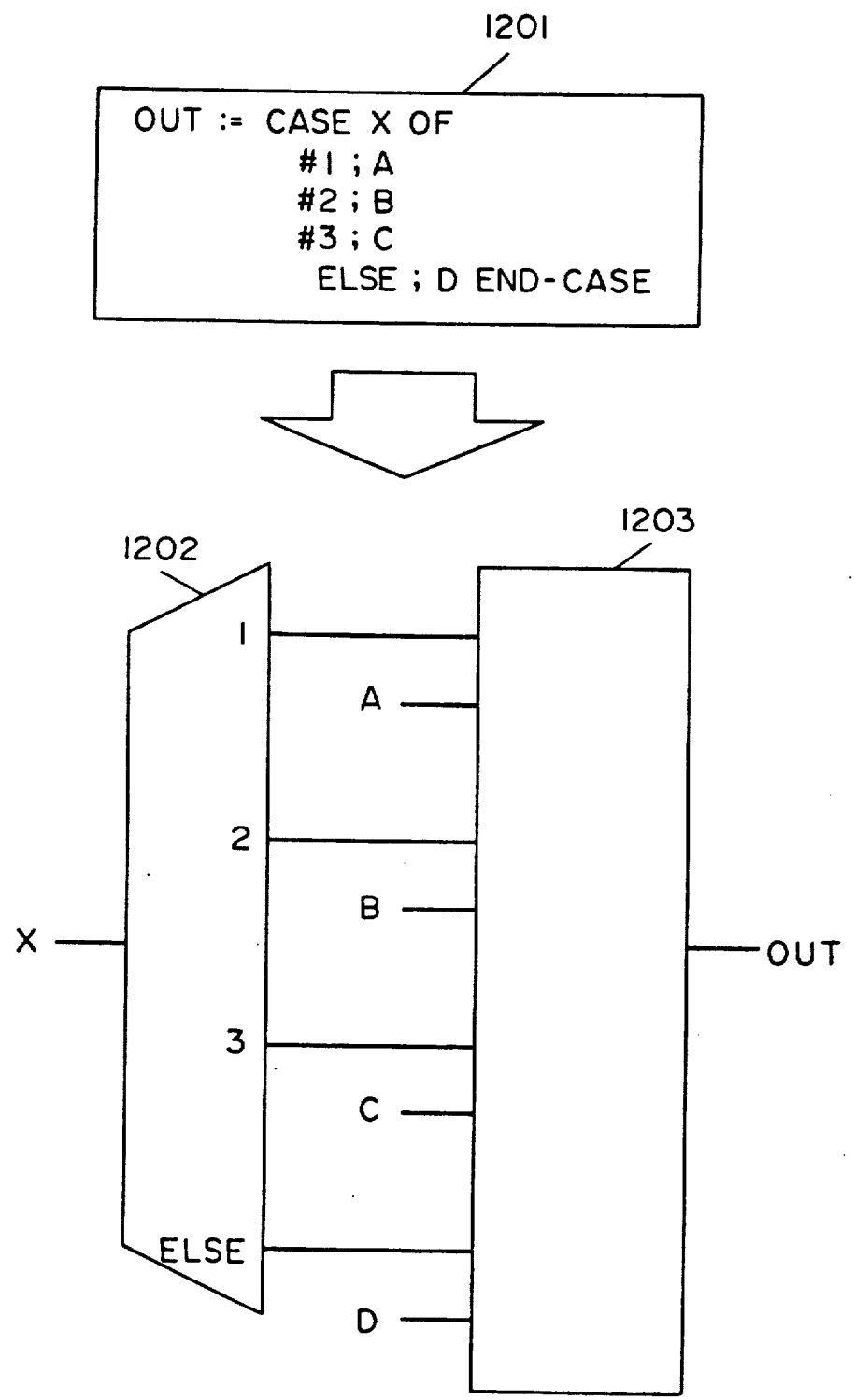
FIG. 12 is an explanatory drawing of a conversion example relating to CASE-statement.

FIG. 12 shows an example of the conversion of a CASE statement, in which 1201 indicates the substitution condition into OUT using the CASE statement. Which value of A, B, C, D is to substitute depends on the result of decoding of the value of X. In other words, as a result of decoding X, A, B, C, D are substituted, corresponding to 1, 2, 3, ELSE. Numeral 1202 denotes a decoder for decoding signal X. Output signal lines corresponding to each value of X are connected to the selector 1203 as enable signals. To this selector, substitute values corresponding to each enable signal are connected in pairs. As evident from this example, the CASE statement is converted into the decoder in order to realize its function.

The conversion rule shown in this example is described in the foregoing IF-THEN rule, but aside from this it is also possible to express the relation of the condition of the IF part and the execution command of the THEN part by using table or others.

Next is explained the expression format of the function blocks such as INVERTER, AND, SELECTOR and DECODER used in the net list. FIG. 13 shows an expression example of each function block presented in the above examples. General formats of the function block expression used in this invention are as follows.

---
COMPONENT-NAME ::: PROPERTY-NAME1:: value 1;
PROPERTY-NAME2:: value 2;
.
.
PROPERTY-NAMEn:: value n.
---

A COMPONENT-NAME refers to the name of the function block itself. In this case, serial numbers attached to each function block are assigned. PROPERTY is for classifying the nature of the data possessed by the frame. Data prepared as PROPERTY include A-KIND-OF slot for expressing to which type the function block belongs, INPUT slot for expressing the input to the gate, OUTPUT slot for expressing similarly the output, and BITWIDTH slot for expressing the bit width of the function block. VALUE is the actual value itself. If plural values are present, they are expressed in a list. All input slot values in the gate block, except for the inverter gate, are plural. They are, for example, expressed as [net165, net172]. Here, "net" means a signal wire for connecting function blocks. By describing the function block by using such frame structure, the list data may be easily taken into the system.

Parallel to generation of the function block, module parsing is effected. This is intended to adjust among modules necessary for synthesis and division of modules according to the request of the designer when a hierarchical design is devised. In a hierarchical design, matching of input and output among modules is indispensable. FIG. 14 is an example of module synthesis. MODULE-A of 1401 possesses IN0, IN1 as inputs, and NET0, NET1, NET2, NET3 as outputs. Numerals 1402, 1403, 1404, 1405 are D-flip-flops receiving outputs NET0, NET1, NET2, NET3 of 1401 as inputs. To each D-flip-flop, CLOCK is connected as a clock signal, and RESET as a reset signal. Outputs of 1402, 1403 are Out0, Out1, while 1404, 1405 are connected again to MODULE-A by way of NET4, NET5. Such a circuit, is regarded as one module, a new module having six terminals, that is, CLOCK, RESET, In0, In1, Out0, Out1. MODULE-B of 1406 is its symbol. In this invention, at the time of module synthesis, input and output of a newly generated module are recognized by using a module parsing knowledge 124. The request from the designer for synthesis is effected through inquiry means 132.

After this processing operation, a net list of function blocks is generated, and to terminate the logic designing, it is necessary to further develop the function block and assign the target technology with circuits. After these processing operations, a desired logic circuit is finally obtained. Embodiments relating to function block development and technology mapping are described in detail in the Japanese patent application No. 62-241288.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A computer processing method for translating a function description of a circuit, said computer processing method comprising:
   a parsing step for parsing, using a computer system, the function description of the circuit in hardware description language to generating a parse tree;
   a tree structure deforming step for deforming, using the computer system, a structure of the parse tree generated during said parsing step and for optimizing a text level redundancy in said parse tree; and a function block generation processing step for translating, using the computer system, the thus deformed parse tree into a circuit configuration made up of function blocks, thereby translating the function description of the circuit into connection information among function blocks as a hardware image.

2. A computer processing method according to claim 1, said tree structure deforming step further including a step for inquiring for information relating to a user's intention regarding conversion or logic designing.

3. A computer processing method according to claim 1, further comprising a module parsing processing step for adjusting among partial circuits between strata or within a same stratum, along with a change in a hierarchical structure of circuits by hierarchical design, wherein information relating to execution of adjusting resulting from the change is inquired during an inquiring step of said parsing step.

4. A logic design system for translating a function description of a circuit, said logic design system comprising:
   means for parsing the function description of a circuit to generate a parse tree;
   means for deforming a structure of said parse tree generated by said means for parsing to generate a deformed parse tree having an optimal text level redundancy, and means for translating said deformed parse tree, generated by said means for deforming, into a circuit configuration made up of function blocks.

5. A logic design system as recited in claim 4, further comprising first memory means for storing the syntax and dictionary of hardware description language necessary for processing of said means for parsing, second memory means for storing deformation criteria necessary for tree structural deforming of said means for deforming, third memory means for storing criteria for converting the deformed tree structure into connection information among function blocks, and fourth memory means for storing the information obtained by inquiry to confirm the intent of the designer or the data of knowledge source as translation knowledge, which are combined into a first knowledge base, wherein said first knowledge base is used when translating from said function description into function blocks.

6. A logic design system recited in claim 5, wherein a fifth knowledge base for storing criteria for changing a hierarchical structure of the circuit is further combined to said first knowledge base to compose a second knowledge base and said second knowledge base is used during processing.

7. A logic design system as recited in claim 4, further comprising means for storing deformation criteria to be used by said means for deforming a structure of said parse tree.

* * * * *